United States Patent

[11] 3,582,825

[72] Inventor Masatoshi Migitaka
Kodaira-shi, Japan

[21] Appl. No. 746,116
[22] Filed July 19, 1968
[45] Patented June 1, 1971
[73] Assignee Hitachi, Ltd.
Tokyo, Japan
[32] Priority July 31, 1967
[33] Japan
[31] 42/4800 48,800

[54] VARIABLE FREQUENCY SOLID-STATE OSCILLATOR
4 Claims, 4 Drawing Figs.

[52] U.S. Cl. .......... 331/107G, 317/234V
[51] Int. Cl. .......... H03b 7/06
[50] Field of Search .......... 317/234; 331/107, 107 G

[56] References Cited
UNITED STATES PATENTS
3,377,566 4/1968 Lanza .......... 331/107

*Primary Examiner*—John Kominski
*Attorney*—Craig, Antonelli, Stewart & Hill

ABSTRACT: A variable frequency solid-state oscillator having on a surface of a trapezoid-shaped semiconductor substrate a laterally trapezoid-shaped epitaxial layer of N-type semiconductor monocrystal, the four sides of the trapezoid being planes of cleavage, a negative electrode being provided on the shorter side of the parallel opposite sides of the semiconductor layer on the substrate, and a positive electrode being provided on the longer side of the parallel opposite sides of the semiconductor layer on the substrate. Said oscillator oscillates with a frequency corresponding to the applied voltage when various values of voltage are applied to said device through said electrodes with means for applying excitation voltages.

PATENTED JUN 1 1971

3,582,825

INVENTOR

MASATOSHI MIGITAKA

BY Craig & Antonelli

ATTORNEYS

VARIABLE FREQUENCY SOLID-STATE OSCILLATOR

BACKGROUND OF THE INVENTION

This invention relates to a so-called Gunn effect solid-state oscillator, wherein a high frequency current oscillation takes place when a high voltage is applied to a high resistivity N-type GaAs, InP or the like material, known as a multivalley semiconductor material, and the method of manufacture thereof. This invention relates more particularly to a variable frequency solid-state oscillator in which the frequency of said high frequency current oscillation varies in correspondence with the value of said applied voltage, and the method of manufacture thereof.

As is well known, a Gunn effect solid-state oscillator consists of a semiconductor monocrystal having a specific resistance of a few to a hundred ohm-cm. like N-type GaAs or InP and electrodes of ohmic contact provided at the two ends thereof, and when an electric field having an intensity larger than a threshold value is applied to said semiconductor monocrystal wafer through said electrodes, a current oscillation with a frequency determined by $Vd/l$ takes place. Here $l$ indicates the thickness of the semiconductor monocrystal to which the electric field is applied or the carrier transit length and $Vd$ indicates a carrier drift velocity in the semiconductor monocrystal. Said carrier drift velocity $Vd$ remains substantially constant under the field intensity generating current oscillation (e.g. about $10^7$ cm./sec. at an ordinary temperature in GaAs) and accordingly, even when the applied voltage changes, the oscillation frequency remains substantially unchanged.

In order to change the oscillation frequency of such a device, such proposals as the following ones have been made. According to one proposal, the oscillation frequency is forcibly changed by inserting the solid-state oscillator into a resonance circuit which can produce a resonance frequency close to the oscillation frequency of a solid-state oscillator and changing the resonance frequency of said resonance circuit. According to another proposal, the oscillation frequency is changed by applying a stress to a semiconductor composing an oscillator and thereby changing the thickness $l$ of the semiconductor or the carrier drift velocity $Vd$. However, according to such methods, the oscillation frequency cannot be varied over a wide range and moreover, when the oscillation frequency is to be modulated with an electrical signal, mechanical means must be provided and thus the structure becomes complicated.

In order to obviate the deficiencies described hereinabove, there has been proposed a variable frequency solid-state oscillator wherein the surfaces of the semiconductor, except the surface on which electrodes are provided, are tapered in such a way that the area of the two electrodes provided at the two ends of the semiconductor composing the oscillator may become different. In an oscillator having such a structure, since a slope appears in the distribution of the electric field, the oscillation frequency can be changed by about 50 percent by varying the external voltage if means are provided which makes the electric field at a part of the semiconductor more intense than a minimum intensity for oscillation or a threshold electric field intensity. However, tapering of the surfaces of a semiconductor except the surface where electrodes are provided can only be done by polishing and it has been difficult to make the thickness of said semiconductor smaller than a certain value due to the required accuracy of manufacture. Further, in order to change the frequency effectively in such a structure, the thickness of the semiconductor must be larger than the size of the electrodes. In a general solid-state oscillator, in order to enhance the oscillation frequency, to facilitate the dissipation of heat generated in the semiconductor and to perform continuous oscillation, the thickness of the semiconductor is made smaller than $20\mu$ and the size of the electrode is made to be of the order of $100\mu \times 100\mu$. However, in the solid-state oscillator described above, the thickness of the semiconductor cannot be made smaller than a certain value due to the required accuracy of manufacture and the size of the electrodes and accordingly, it has been impossible to provide a variable frequency solid-state oscillator which oscillates with a high frequency comparable to that of a general high frequency solid-state oscillator and performs continuous operation.

SUMMARY OF THE INVENTION

An object of this invention is to provide a variable frequency solid-state oscillator whose oscillation frequency can be changed drastically by a small change in applied voltage.

Another object of this invention is to provide a variable frequency solid-state oscillator capable of continuous operation.

A further object of this invention is to provide a variable frequency solid-state oscillator which is easy to construct.

Another object of this invention is to provide a method for making a variable frequency solid-state oscillator whose oscillation frequency can be changed drastically by a small change in applied voltage.

Another object of this invention is to provide a method for making a variable frequency solid-state oscillator capable of continuous operation.

Another object of this invention is to provide a method for making a variable frequency solid-state oscillator which is easy to construct.

DESCRIPTION OF THE PREFERRED EMBODIMENTS

Figure 1:
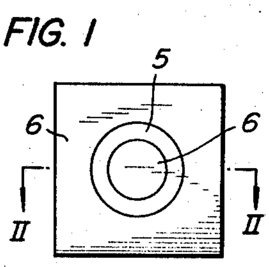
FIG. 1 is a plan view of an embodiment of this invention.

Gunn effect oscillation is caused by the following mechanism. Namely, a part of the carriers in a semiconductor monocrystal energized by the applied electric field undergoes a transition from an energy band wherein the effective mass is small to an energy band wherein the effective mass is large in an electric field whose intensity is larger than a threshold value, and thus, on the average, the effective mass of all the carriers increases, the mobility and the electric conductivity decreases, the number of said transition carriers increases and thereby a negative resistance appears. Further detailed investigation on such a mechanism of oscillation shows that a low conductivity region due to said transition carriers or a high field domain (referred to as a domain hereafter) is generated within a semiconductor monocrystal on account of the energy of the applied voltage above a threshold value, and said domain travels towards a positive electrode with the same speed as the drift velocity of the carriers. When the domain reaches the electrode, it is annihilated. Then, the domain is formed again and repeats said process of travelling between the electrodes. In this case, the current generated when the electric field is applied decreases due to the formation of a domain and is then restored when the domain reaches the electrode and is annihilated. Due to said repetition of increase and decrease in current, an oscillating current appears.

However, said domain is usually formed in the vicinity of a negative electrode where the slope of the potential is large compared with the slope inside of a semiconductor monocrystal, reaches a positive electrode and annihilates, but the annihilation of the domain occurs even in the middle of the two electrodes if the electric field intensity becomes lower than the threshold value. Accordingly, if the increase and decrease of the part of the semiconductor monocrystal having an electric field intensity higher than the threshold value is controlled by inducing a distribution of an electric field in a semiconductor monocrystal and suitably controlling the applied voltage, the oscillation frequency can be easily controlled.

Now, if the cross section of a semiconductor monocrystal composing an oscillator, which is perpendicular to the direction of the flow of a current in the semiconductor when an electric field is applied to said semiconductor monocrystal, is made to decrease in the direction of the flow of the current, the electric field applied to said semiconductor monocrystal becomes inversely proportional to the cross section, or in other words, the intensity of the electric field becomes high in the vicinity of the small cross section and it becomes lower as the cross section becomes larger. Thus, a distribution of an electric field can be formed in a semiconductor monocrystal. Accordingly, the oscillation frequency can be changed by varying the external applied electric field as described hereinabove.

According to this invention, the frequency is changed based on said principle. What is most important in this invention is to provide a semiconductor monocrystal, which generates current oscillation when an intense electric field is applied, on a substrate having a specific resistance higher than that of said semiconductor monocrystal and made of the same semiconductor as said semiconductor monocrystal and to provide a method of making a solid-state oscillator by utilizing the cleavage property of a crystal of the semiconductor monocrystal and the substrate. By so doing, dissipation of heat generated particularly in a semiconductor during operation can be facilitated, continuous operation can be performed, the size of electrodes can be reduced and thereby the transit length of said domain in a semiconductor monocrystal can be made shorter and a high frequency oscillation can be performed. Further, since the specific resistance of the substrate is larger than that of the semiconductor monocrystal, the whole applied electric field is given to said semiconductor monocrystal.

Now, this invention will be described in detail hereinbelow with reference to the embodiments of this invention.

Figure 2:
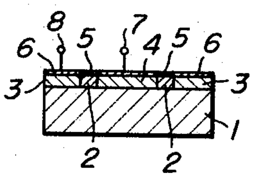
FIG. 2 is a longitudinal sectional view taken along the line II–II of FIG. 1.

Reference numeral 1 in FIGS. 1 and 2 designates a substrate consisting of a GaAs crystal having a specific resistance of about $10^5$ Ωcm. and a thickness of $40\mu$, 2 designates an annular N-type GaAs monocrystal layer provided selectively on said substrate 1 which has an impurity concentration of about $2\times10^{15}$ cm.$^{13}$, a thickness of $10\mu$, an inner diameter of $45\mu$ and an outer diameter of $60\mu$, 3 and 4 designate electrodes in ohmic contact with said N-type GaAs monocrystal layer 2 and in this embodiment, an $N^{++}$type GaAs crystal of about $10\mu$ in thickness is used. Reference numeral 5 indicates a $SiO_2$ film of about $0.6\mu$ in thickness, and 6 indicates nickel plated layers, provided to set electrode leads 7, 8 to the electrodes 3 and 4, which are formed on the surface of said annular N-type GaAs monocrystal layer 2 and on the surfaces of the electrodes 3 and 4.

When a DC voltage of 4 v. is applied to such a solid-state oscillator in a way that the electrode 4 becomes a negative electrode and the electrode 3 becomes a positive electrode after the substrate 1 is fused into a part of a waveguide, oscillation of 13 GHz. in frequency and 200 mW. in output takes place. When a DC voltage of 5.5 v. is applied, oscillation of 7.5 GHz. in frequency and 400 mW. in output is obtained. The oscillation frequency can be further controlled by changing the applied voltage.

The solid-state oscillator described hereinabove can be fabricated by utilizing conventional semiconductor techniques.

First, a GaAs crystal of about $10^5$ Ωcm. in specific resistance is formed by the melt growth or vapor growth methods while doping deep level material like oxygen, chromium, etc. Then, an N-type GaAs monocrystal layer having a thickness of $10\mu$ and an impurity concentration of $2\times10^{15}$ cm.$^{13}$ is vapor grown on said GaAs crystal used as a substrate. Further, a $SiO_2$ layer of about $0.6\mu$ in thickness is grown on said N-type GaAs monocrystal layer by decomposition of ethyl oxide. After said process, photosensitive resin is deposited on said $SiO_2$ layer and after it is dried, an annular pattern is printed and developed. Then, unnecessary parts of said $SiO_2$ layer and said N-type GaAs monocrystal layer are etched away with an etching solution containing fluoric acid or sulfuric acid until said substrate is exposed and an annular mesa is formed. Then, after eliminating said photosensitive resin, a material which forms ohmic contact with said N-type GaAs monocrystal, for example tin saturated with GaAs, etc., is provided to form electrodes. Said electrodes can be formed generally by inserting the whole crystal obtained in the way described hereinabove into an electric furnace of about 600° C., contacting tin saturated with GaAs to the exposed surface of the substrate by the method described hereinabove and then slowly cooling the whole crystal. Subsequently said $N^{++}$ type GaAs layer is plated with nickel and lead wires are provided. In this way, the solid-state oscillator according to this invention, i.e. a solid-state oscillator wherein the cross section perpendicular to the path of the current running from the electrode 3 to the electrode 4 becomes concentrically larger towards the electrode 4, is provided.

Figure 3:
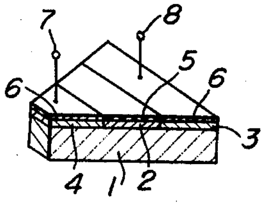
FIG. 3 is a perspective view of another embodiment of this invention.

FIG. 3 shows a perspective view of another embodiment of this invention, wherein the same parts as appear in FIG. 1 are denoted by the same reference numerals as used in FIG. 2.

In a solid-state oscillator having a structure as shown in FIG. 3, when a DC voltage of 4 v. is applied in a way that the electrode 4 becomes a negative electrode and the electrode 3 becomes a positive electrode after fusing the substrate 1 into a part of a waveguide, oscillation of 14 GHz. in frequency and 200 mW. in output takes place, and when a DC voltage of 5 v. is applied, oscillation of 8 GHz. in frequency and 350 mW. in output takes place the oscillation frequency can be arbitrarily changed by changing the applied voltage. The distance between said electrodes 3 and 4 is $14\mu$.

In order to obtain a solid-state oscillator as shown in FIG. 3, the cleavage property of a crystal can conveniently be utilized. Namely, the property of a GaAs monocrystal is utilized whereby the {110} plane is more easily broken than the other planes when applying a constant force.

In this method, an N-type GaAs epitaxial layer is grown on a substrate consisting of a GaAs monocrystal having a specific resistance of about $10^5$ Ωcm. and a thickness of $40\mu$ by the same method as described above so that the surface layer becomes a {111} plane.

Figure 4:
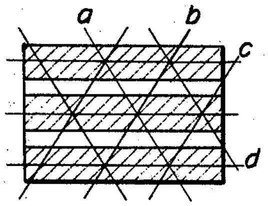
FIG. 4 is a drawing which illustrates a method of making the semiconductor bulk shown in FIG. 3.

The thickness of said GaAs epitaxial layer is made to be about $10\mu$ and the impurity concentration thereof is made to be about $2\times10^{15}$ cm.$^{13}$. Then, a $SiO_2$ layer is formed on said GaAs epitaxial layer as in said embodiment and further photosensitive resin is deposited on said $SiO_2$ layer. On said photosensitive resin, the pattern shown in FIG. 4 is printed. When printing the pattern, the direction of the channels 9 formed in the pattern is made to cross the {110} plane at an angle of about 60°. Since the width of the ditch channel of said pattern corresponds to the distance between the electrodes of the solid-state oscillator provided, the width must be made to be $14\mu$ in the present embodiment. After printing said pattern, etching and electrode formation are performed according to the same process as described in said embodiment. Then, the substrate is cut along the {110} plane (denoted by lines *a*, *b*, *c*, *d* in FIG. 4) to obtain a large number of solid-state oscillator elements as shown in FIG. 3.

As is well known, various angles between the crystal planes are present. For example, the angles formed by said {111} plane and the {110} plane are 35.3°, 90° and the angles formed by the {110} plane and the {110} plane are 0°, 60° and 90°. Therefore, it is possible to make the angle formed by the {111} plane and the {110} plane 90° and the angle formed by the {110} plane and the {110} plane 60° as in said embodiment.

Though this invention has been explained with particular reference to a case where high resistivity GaAs is used for a solid-state oscillator, this invention is by no means restricted to the embodiments described hereinabove. It will be evident to those skilled in the art that various changes and modifications can be made in the external shape and the finer details without departing from the spirit of this invention.

As has been described in detail hereinabove, according to this invention, a semiconductor monocrystal, generating current oscillation when an intense electric field is applied, is provided on a substrate which has a specific resistance higher than that of said semiconductor monocrystal and which consists of the same semiconductor as said semiconductor monocrystal, electrodes in ohmic contact with said semiconductor monocrystal are provided on the two opposing end surfaces different from the surface in contact with said substrate and the cross section of said semiconductor monocrystal perpendicular to the direction of the flow of the current inside when an electric field is applied is made to change in the direction of the flow of said current. Therefore, the oscillation frequency can be changed in correspondence with the change in the applied voltage. Further, since the dissipation of heat generated in the semiconductor monocrystal generating current oscillation is done not only from the electrodes, but also from the side of the substrate, continuous operation producing a large output can be performed stably.

Moreover, an advanced technique of polishing a thin semiconductor monocrystal as has conventionally been performed in obtaining a variable frequency solid-state oscillator is not necessary in this invention, but the oscillator can be obtained by common techniques like optical techniques of photosensitive resin and cleavage. Thus, this invention has a great industrial advantage. Further, since the electrodes in this invention are not used for heat dissipation, but only for feeding an electric field, the electrodes can be made small. Accordingly, the transit length of the domain of the semiconductor monocrystal can be made short in correspondence with the size of said electrodes and an ultrahigh frequency oscillation can be obtained.

I claim:

1. A variable frequency solid-state oscillator comprising:

an N-type semiconductor monocrystal layer wherein current oscillation takes place when an intense electric field is applied thereto;

a semiconductor monocrystal substrate which has a specific resistance higher than that of said semiconductor layer, said semiconductor layer being epitaxially grown on said substrate; said semiconductor layer and said substrate being triangular in shape, said semiconductor layer forming a top face of the resulting triangular body formed by said layers, three side faces of said triangular body being planes of cleavage;

a negative electrode provided at one corner of said triangle of said semiconductor layer on said substrate; and a positive electrode being provided at the side opposite to said corner of said semiconductor layer on said substrate.

2. A variable frequency solid-state oscillator according to claim 1, wherein said substrate is GaAs, said semiconductor monocrystal layer is selected from high resistivity N-type GaAs and InP, said top face of said semiconductor layer has a crystalline surface of {111}, and said side faces of said triangular body have a crystalline surface of {110}.

3. A variable frequency solid-state oscillator comprising:

an N-type semiconductor monocrystal layer wherein current oscillation takes place when an intense electric field is applied thereof;

a semiconductor monocrystal substrate which has a specific resistance higher than that of said semiconductor layer, said semiconductor layer being epitaxially grown on said substrate;

said semiconductor layer and said substrate being a trapezoid in shape, said semiconductor layer forming a top face of the resulting trapezoidal body formed by said layers, four side faces of said trapezoid being planes of cleavage;

a negative electrode being provided on the shorter side of the parallel opposite sides of said semiconductor layer on said substrate; and a positive electrode being provided on the longer side of the parallel opposite sides of said semiconductor layer on the substrate.

4. A variable frequency solid-state oscillator according to claim 3, wherein said substrate is GaAs, said semiconductor monocrystal layer is selected from high resistivity N-type GaAs and InP, said top face of said semiconductor layer has a crystalline surface of {111}, and said side faces of said trapezoid have a crystalline surface of {110}.

UNITED STATES PATENT OFFICE
CERTIFICATE OF CORRECTION

Patent No. 3,582,825 Dated June 1, 1971

Inventor(s) Masatoshi Migitaka

It is certified that error appears in the above-identified patent and that said Letters Patent are hereby corrected as shown below:

Title page, left-hand column, item 31, which now reads:

"42/4800 48,800"

should read as follows:

--48800/67--

Signed and sealed this 22nd day of August 1972.

(SEAL)
Attest:

EDWARD M.FLETCHER,JR.
Attesting Officer

ROBERT GOTTSCHALK
Commissioner of Patents